US011522012B2

(12) United States Patent
Kavalieros et al.

(10) Patent No.: US 11,522,012 B2
(45) Date of Patent: Dec. 6, 2022

(54) DEEP IN MEMORY ARCHITECTURE USING RESISTIVE SWITCHES

(71) Applicant: Intel Corporation, Santa Clara, CA (US)

(72) Inventors: Jack T. Kavalieros, Portland, OR (US); Ian A. Young, Portland, OR (US); Ram Krishnamurthy, Portland, OR (US); Ravi Pillarisetty, Portland, OR (US); Sasikanth Manipatruni, Portland, OR (US); Gregory Chen, Portland, OR (US); Hui Jae Yoo, Portland, OR (US); Van H. Le, Portland, OR (US); Abhishek Sharma, Hillsboro, OR (US); Raghavan Kumar, Hillsboro, OR (US); Huichu Liu, Santa Clara, CA (US); Phil Knag, Hillsboro, OR (US); Huseyin Sumbul, Portland, OR (US)

(73) Assignee: Intel Corporation, Santa Clara, CA (US)

(*) Notice: Subject to any disclaimer, the term of this patent is extended or adjusted under 35 U.S.C. 154(b) by 922 days.

(21) Appl. No.: 16/147,091

(22) Filed: Sep. 28, 2018

(65) Prior Publication Data
US 2020/0105833 A1    Apr. 2, 2020

(51) Int. Cl.
*H01L 27/24* (2006.01)
*G11C 13/00* (2006.01)
*H01L 45/00* (2006.01)
*H01L 29/51* (2006.01)

(52) U.S. Cl.
CPC ...... *H01L 27/2463* (2013.01); *G11C 13/0021* (2013.01); *H01L 27/2436* (2013.01); *H01L 29/517* (2013.01); *H01L 45/16* (2013.01)

(58) Field of Classification Search
CPC . H01L 27/2463; H01L 27/2436; H01L 45/16; G11C 2213/79
See application file for complete search history.

(56) References Cited

U.S. PATENT DOCUMENTS

| | | | | |
|---|---|---|---|---|
| 9,806,255 | B1* | 10/2017 | Hsu | H01L 45/1233 |
| 2010/0084719 | A1* | 4/2010 | Masuoka | H01L 29/7833 |
| | | | | 438/692 |
| 2014/0021584 | A1* | 1/2014 | Tu | H01L 23/5223 |
| | | | | 257/532 |
| 2019/0214559 | A1* | 7/2019 | Clarke | H01L 27/2463 |
| 2019/0354653 | A1* | 11/2019 | Weng | G06F 30/39 |
| 2019/0393267 | A1* | 12/2019 | Pillarisetty | H01L 29/66666 |
| 2020/0136040 | A1* | 4/2020 | Chang | H01L 45/08 |
| 2020/0144496 | A1* | 5/2020 | Glassman | H01L 45/1253 |
| 2020/0203602 | A1* | 6/2020 | Asuri | H01L 23/528 |

* cited by examiner

*Primary Examiner* — Joseph C. Nicely
(74) *Attorney, Agent, or Firm* — Schwabe, Williamson & Wyatt, P.C.

(57) ABSTRACT

A DIMA semiconductor structure is disclosed. The DIMA semiconductor structure includes a frontend including a semiconductor substrate, a transistor switch of a memory cell coupled to the semiconductor substrate and a computation circuit on the periphery of the frontend coupled to the semiconductor substrate. Additionally, the DIMA includes a backend that includes an RRAM component of the memory cell that is coupled to the transistor switch.

19 Claims, 10 Drawing Sheets

DEEP IN MEMORY ARCHITECTURE USING RESISTIVE SWITCHES

TECHNICAL FIELD

Embodiments of the disclosure pertain to deep in memory architecture and, in particular to, deep in memory architecture that uses resistive switches.

BACKGROUND

Deep in-memory architecture (DIMA) provides embedded computation functionality in memory arrays. As a part of the accessing of memory cells of DIMA memory arrays, multiple array rows are accessed and processed at the same time. Embedded analog processing circuitry is positioned at the periphery of the DIMA frontend.

In a conventional approach, DIMA can use either analog or digital computation (e.g., word line pulse amplitude or width modulated). The charge that is produced at the memory cell bit line responsive to the digital level that is placed on a DIMA word line provides a DAC operation. However, the effectiveness of the DAC operation is limited by sensing margin related issues. Additionally, because each memory cell of the DIMA array includes six transistors, the size of the area that is needed to accommodate the array necessitates the positioning of processing circuitry at the periphery of the DIMA frontend.

DESCRIPTION OF THE EMBODIMENTS

Figure 1A:
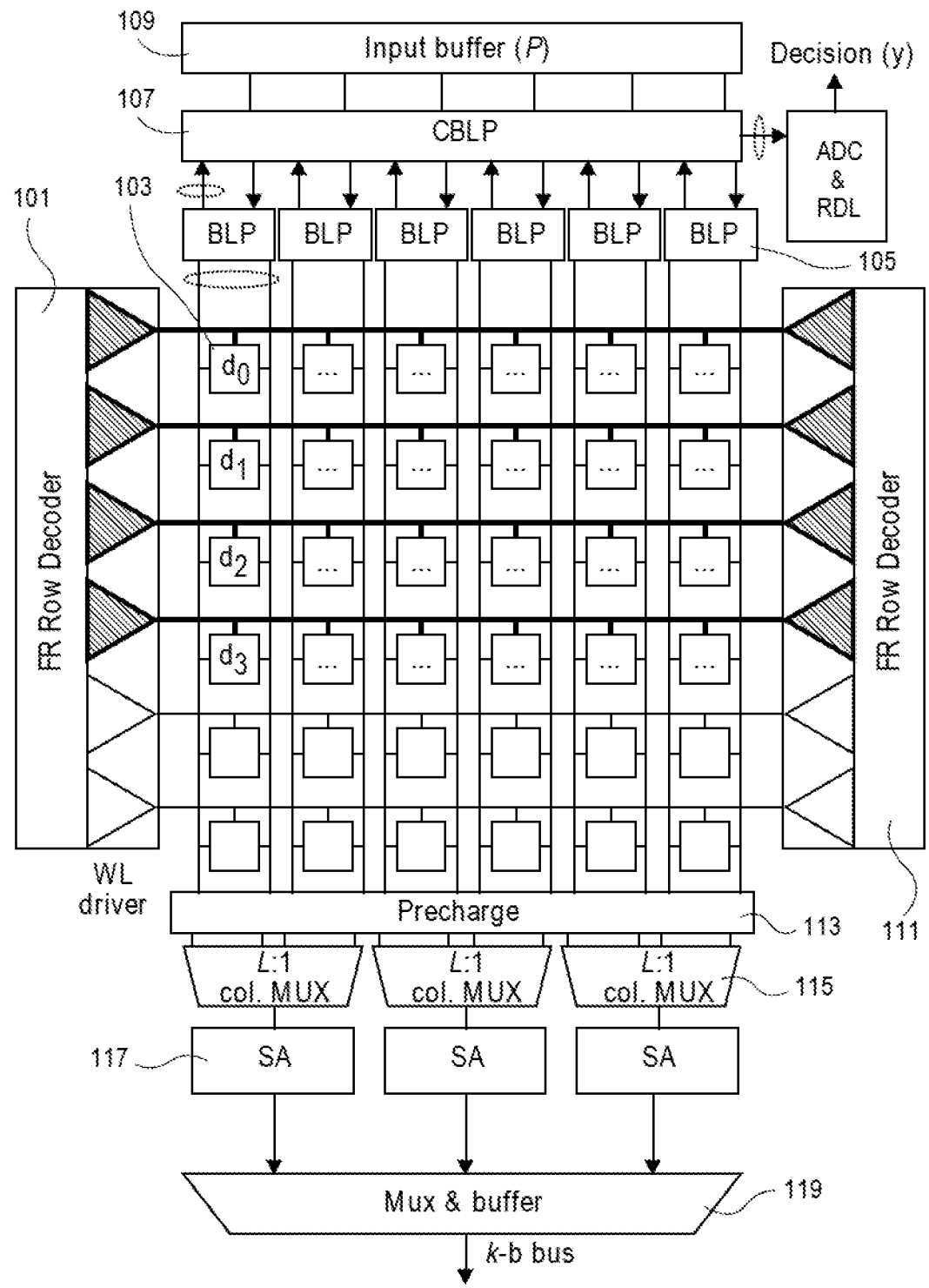
FIG. 1A is an illustration of a static random access memory (SRAM) deep in memory architecture (DIMA) of a previous approach.

Deep in memory architecture using resistive switches. It should be appreciated that although embodiments are described herein with reference to example deep in memory architecture implementations, the disclosure is more generally applicable to deep in memory architecture implementations as well as other type deep in memory architecture implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Deep in-memory architecture (DIMA) provides embedded computation functionality in memory arrays. In a previous approach, as a part of the accessing of memory cells of DIMA memory arrays, multiple array rows are accessed and processed at the same time. In such previous approaches, DIMA can use either analog or digital computation (e.g., word line pulse amplitude or width modulated). The charge that is produced at the memory cell bit line responsive to the digital level that is placed on a DIMA word line provides a DAC operation. However, the effectiveness of the DAC operation is limited by sensing margin related challenges. Additionally, because each memory cell of the DIMA array includes six transistors, the size of the area that is needed to accommodate the array necessitates the positioning of processing circuitry at the periphery of the DIMA frontend.

An approach that addresses and overcomes the shortcomings of previous approaches is disclosed herein. As part of the approach, a DIMA array that includes RRAM memory cells that have a one transistor and one resistor circuit structure is provided. In an embodiment, either the resistor or both the resistor and the transistor of the RRAM memory cells are positioned in the backend of a semiconductor structure of which the DIMA array is a part. In an embodiment, the positioning of either the resistor or both the resistor and the transistor of the RRAM memory cells in the backend of the semiconductor structure frees up space on the frontend of the semiconductor structure for other components such as circuitry that is typically positioned in the peripheral portion of the semiconductor structure (e.g., multiply and accumulate circuitry).

FIG. 1A is an illustration of a static random access memory (SRAM) DIMA of a previous approach. FIG. 1A shows row decoder and word line driver 101, memory cells 103, bit line processor 105, cross bit line processor 107, input buffer 109, row decoder 111, precharge circuit 113, column multiplexor 115, sense amplifier 117 and multiplexor and buffer 119.

Referring to FIG. 1A, each memory cell 103 in the memory cell array contains 6 transistors (e.g., 6T memory cell). The large size of the memory cell requires that the components of the circuitry that are related to the multiplication and aggregation of voltages that is a part of the DIMA be placed in the periphery of the semiconductor structure. In this approach, the SRAM DIMA can use either analog (word line modulated or width modulated) or digital computation. The charge represents DAC operation but is limited due to the sensing margin.

Figure 1B:
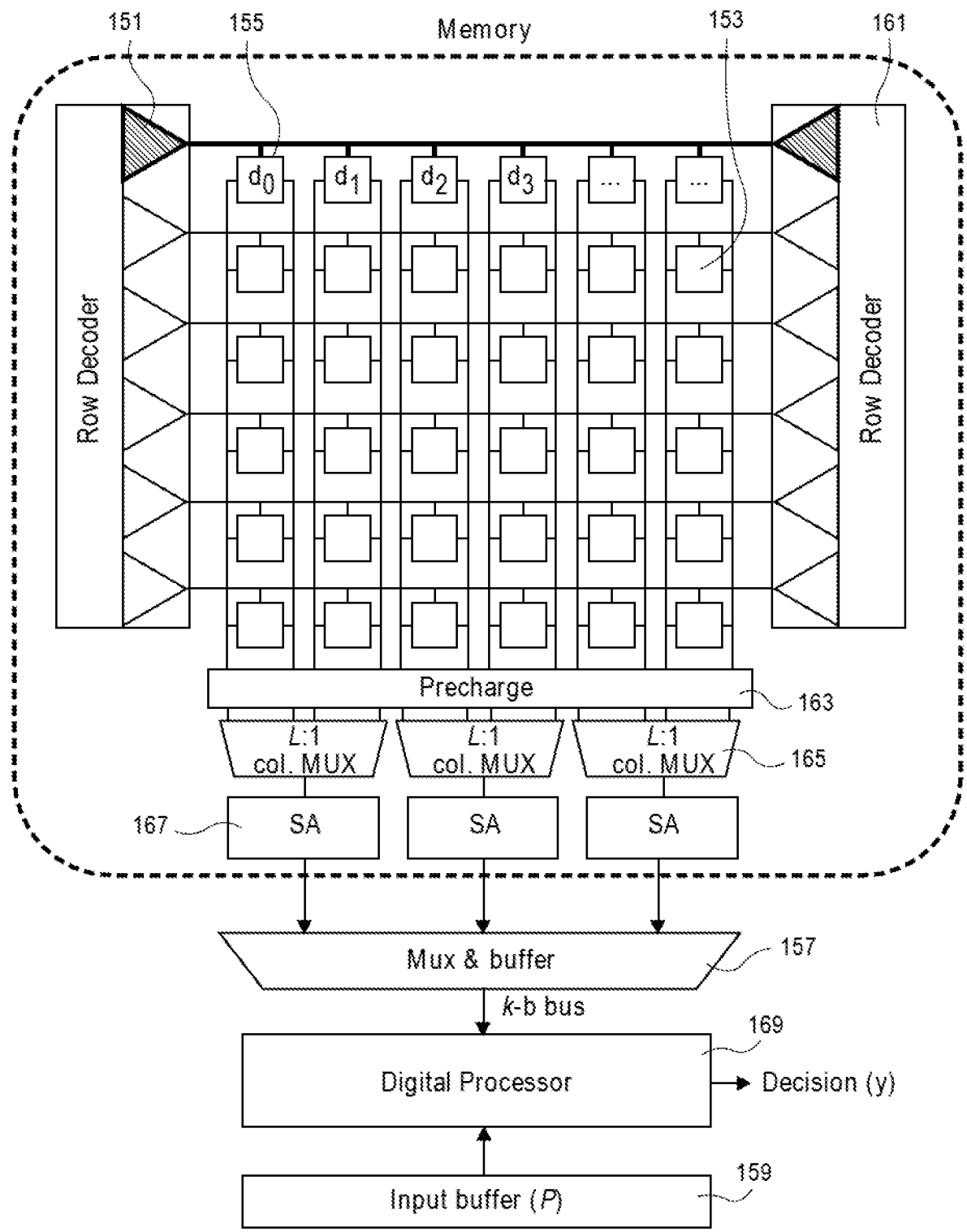
FIG. 1B is an illustration of an SRAM DIMA of another previous approach.

In operation, to store data, the SRAM DIMA stores data in a column-major format in contrast to the row-major format used in the digital architecture (see FIG. 1B). To read data, the SRAM DIMA reads a function of rows, or a word-row, in contrast to a single row as done conventionally per BL precharge (read cycle). This process, referred to as multi-row functional read (FR), generates a BL voltage drop that is proportional to a weighted sum of the bits per column by using pulse-width modulated (PWM) or pulse amplitude modulated (PAM) WL signals. In this approach, the SRAM DIMA requires many fewer read cycles than does conventional architectures to read the same number of bits which provides both energy and throughput benefits.

FIG. 1B is an illustration of an SRAM DIMA of another previous approach. FIG. 1B shows row decoder and word line driver 151, memory cells 153, bit line processor 155, multiplexer and buffer 157, input buffer 159, row decoder and word line driver 161, precharge 163, column multiplexer 165, sense amplifier 167, and digital processor 169.

Referring to FIG. 1B, each memory cell 153 in the memory cell array contains 6 transistors (e.g., 6T configuration). The large size of the memory cell requires that the components of the circuitry that are related to the multiplication and aggregation of voltages that is a part of the SRAM be placed in the periphery of the semiconductor structure. In this approach, the SRAM can use either analog (word line modulated or width modulated) or digital computation. The charge that is presented on bit lines in response to the voltage that is applied to word lines is part of a DAC operation whose effectiveness is limited due to the sensing margin issues.

In operation, a read is effected by precharging both of the bit lines associated with a memory cell, to high voltage. Then, the word line WL is asserted, which enables the memory cell access transistors, and causes one of the bit line voltages to slightly drop. Thereafter, the memory cell bit lines will have a small voltage difference between them. A sense amplifier is used to sense which line has the higher voltage and to determine whether there is logic 1 or 0 stored.

In a conventional approach, the write cycle for SRAM begins with the application of the value to be written to the bit lines. If a logic 0 is to be written, a logic 0 is applied to the bit lines, e.g., BL' is set to logic 1 and BL is set to logic 0. A logic 1 is written by inverting these bit line values. The WL is then asserted to store the value to the SRAM memory cell.

It should be appreciated that a significant shortcoming of the approaches shown and described with reference to FIGS. 1A and 1B, is that the large size of the memory cells in these approaches requires that the computational circuitry be positioned in the area limited frontend periphery of the semiconductor structure of which the memory cell array is a part. This shortcoming as well as the sensing margin related shortcomings of these approaches are addressed by the embodiments described with reference to FIGS. 2A-2D and FIGS. 3A-3B.

Figure 2A:
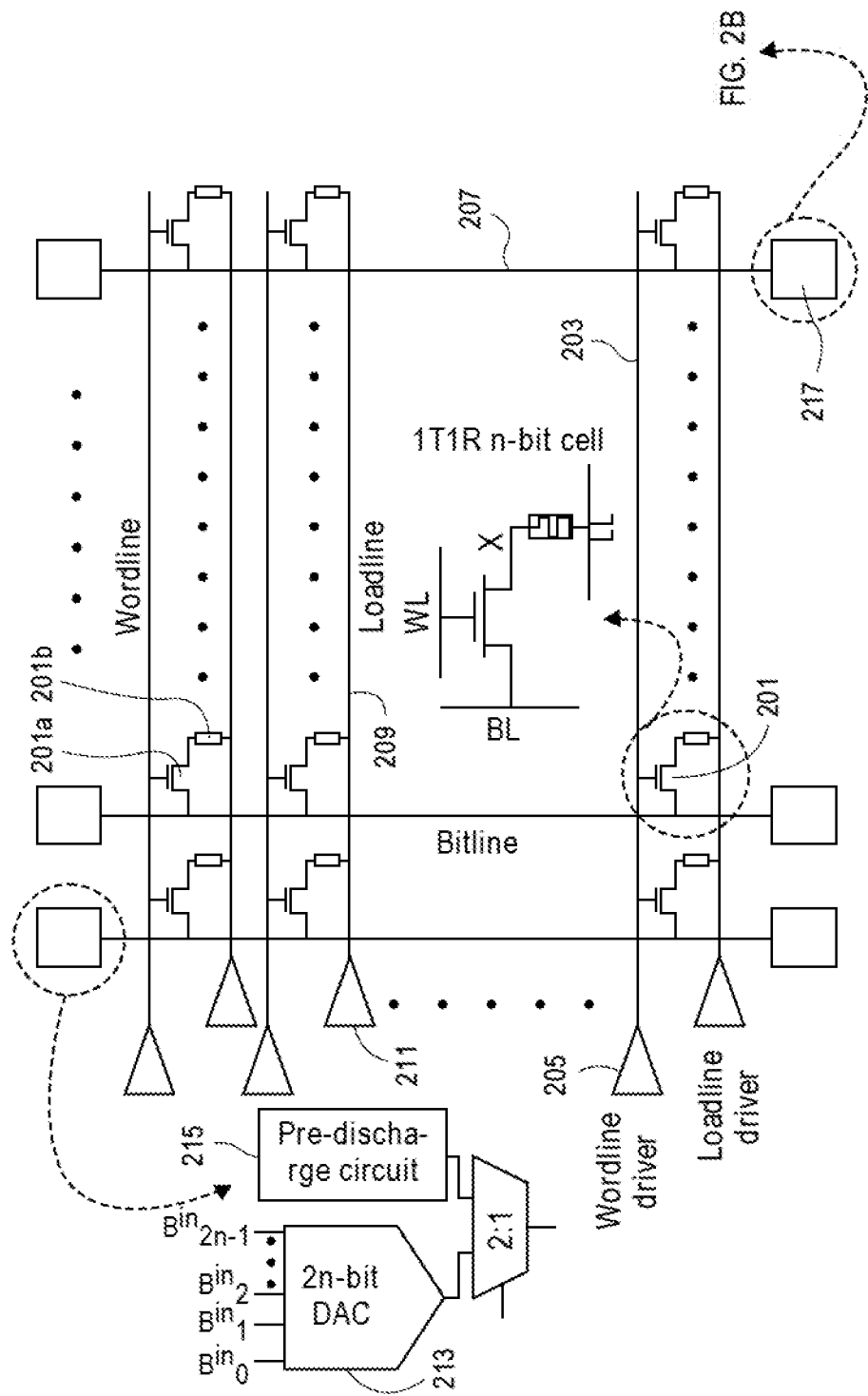
FIG. 2A shows a DIMA memory system according to an embodiment.

FIG. 2A shows a DIMA memory system according to an embodiment. FIG. 2A shows memory cells 201, word lines 203, word line drivers 205, bit lines 207, load lines 209, load line drivers 211, DAC circuitry 213, pre-discharge circuitry 215 and ADC circuitry 217.

Referring to FIG. 2A, the memory cells 201 include a single transistor 201a and a single resistor 201b. The gate of the transistors 201a in the memory cells 201 are coupled to the word lines 203. The drain of the transistors 201a in the memory cells 201 are coupled to bit lines 207. The load lines 209 are coupled to the single resistor 201b. The word lines 203 are coupled to the word line drivers 205. The bit lines 207 are coupled to the DAC 213/pre-discharge circuitry 215 at a first end and to the ADC circuitry 217 at a second end.

The memory cells 201 feature a one transistor and one resistor (1T1R) RRAM structure in contrast to the 6T SRAM memory cell structure of conventional DIMA architectures. In an embodiment, the memory cells 201 occupy a many times smaller area as compared to high density cell (HDC) SRAM. In an embodiment, nonvolatile weights are used as part of multilevel memory cell operation. In an embodiment, within one array compute is provided as compared to the two array compute of SRAM DIMA. More specifically, in an embodiment, the computational circuitry can reside in the same array as does storage components of the DIMA memory system. In an embodiment, the DIMA memory system of FIG. 2A can use a front end transistor and a backend resistor as part of the 1T1R RRAM memory cells of the memory cell array. This positioning of the resistors of the memory cell in the backend of the semiconductor structure frees up space on the periphery of the frontend that can be used for computational circuitry. Moreover, certain components such as switched capacitor can require space for implementation. In an embodiment, sufficient space is enabled to accommodate the periphery.

Figure 3A:
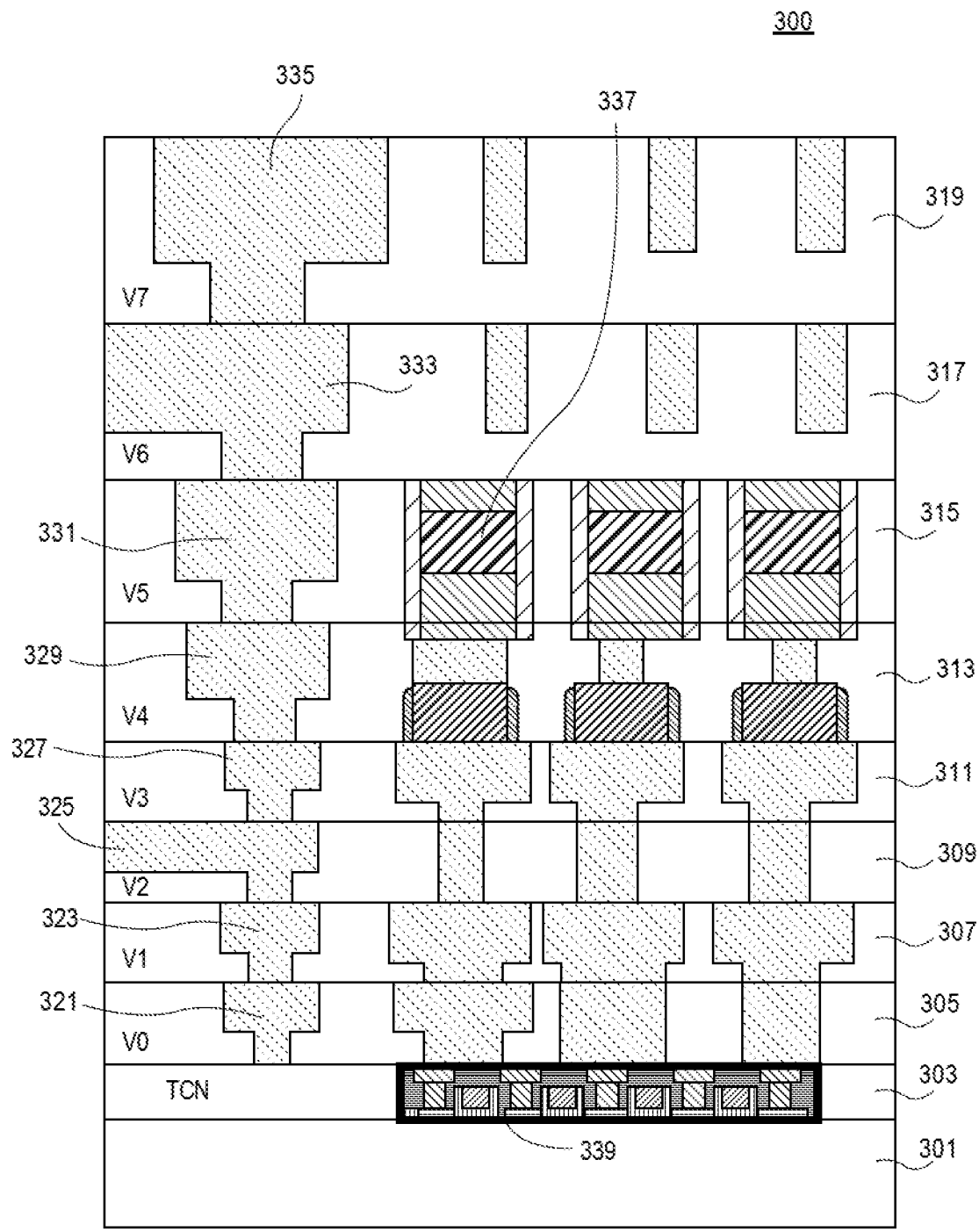
FIG. 3A shows a semiconductor structure that includes a deep in memory architecture (DIMA) memory system that includes a backend array that features a one transistor and one resistor (1T1R) memory cell structure according to an embodiment.

In other embodiments, the DIMA memory system can use both a backend transistor and a backend resistor as part of the 1T1R RRAM memory cells (see FIG. 3A)

Figure 2B:
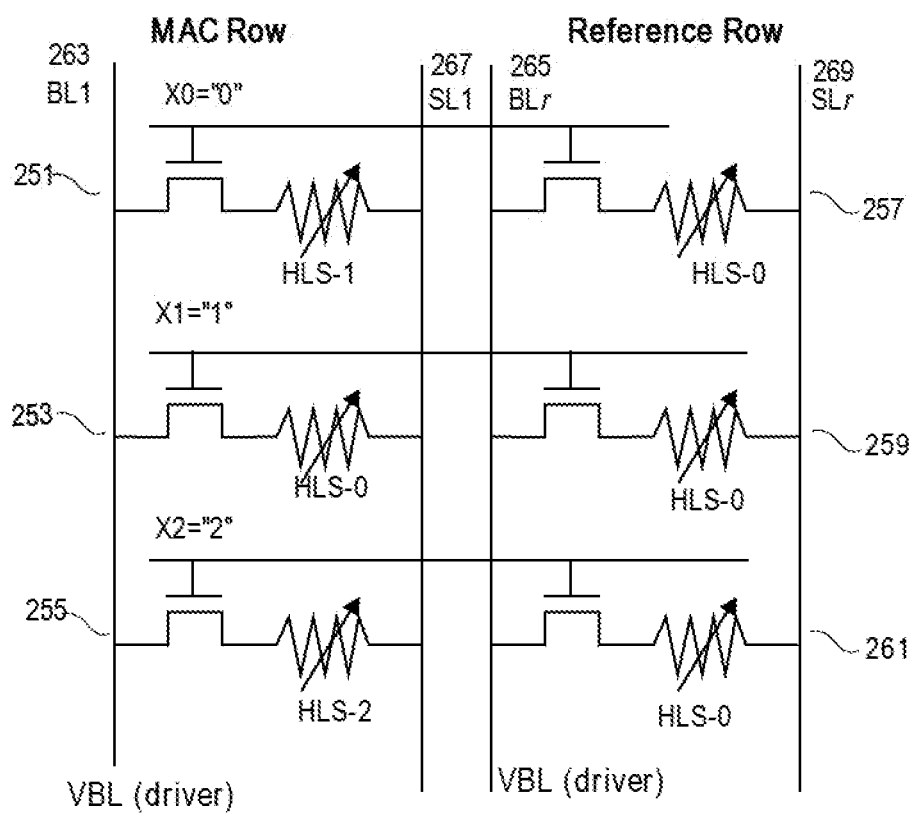
FIG. 2B is an illustration of multiply and accumulate (MAC) rows and reference rows according to an embodiment.
Figure 2C:
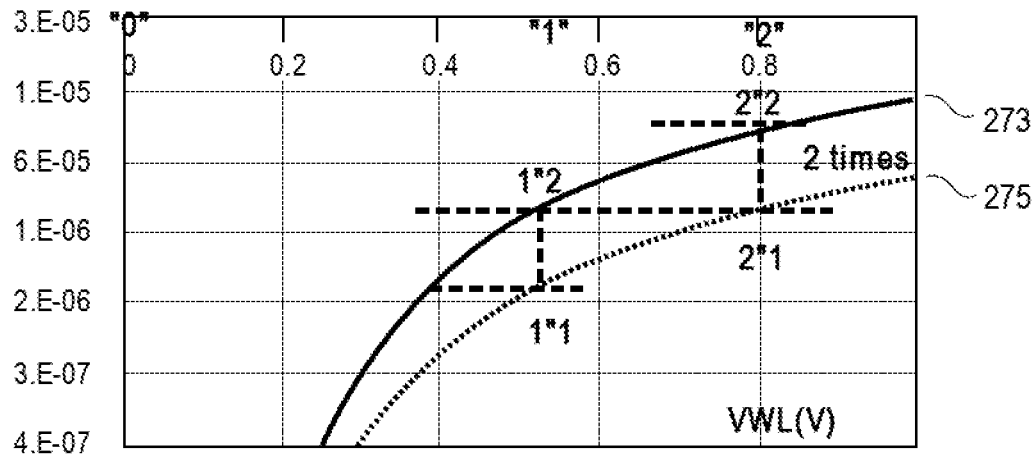
FIG. 2C is a graph of differential sensing current for memory cells shown in FIG. 2B according to an embodiment.

FIG. 2B is an illustration of multiply and accumulate (MAC) rows and reference rows according to an embodiment. FIG. 2B shows MAC rows 251-255, reference rows 257-261, BL1 263, BLr 265, SL1 267, and SLr 269. In an embodiment, a MAC equation, X0*W0+X1*W1+X2*W2=ISL1-ISLr, can be used to determine the differential current associated with a set of memory cells. Moreover, in an embodiment, the differential current can be determined by subtracting a reference current ISLr that is sensed on SLr 269 from the current ISL1 that is sensed on SL1 267. FIG. 2C is a graph of the differential sensing current for memory cells shown in FIG. 2B according to an embodiment. FIG. 2C shows relative to weights times inputs (X*W) 271, sensed current trace 273, and reference current trace 275.

Figure 2D:
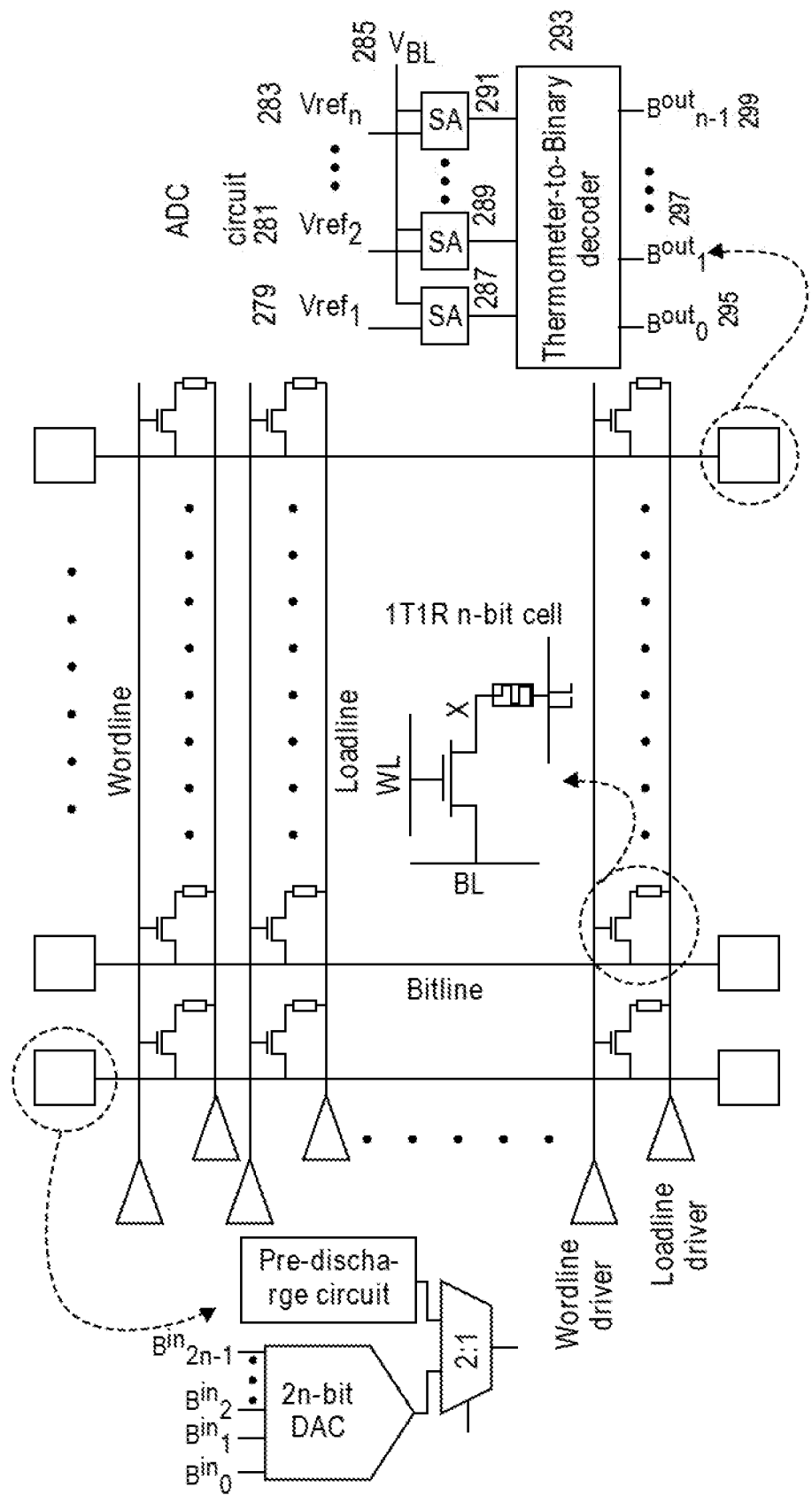
FIG. 2D shows an analog to digital convertor (ADC) according to an embodiment.

FIG. 2D shows an analog to digital convertor (ADC) according to an embodiment. FIG. 2D shows reference voltages 279-283, bit line voltage 285, sense amps 287-291, decoder 293 and outputs 295-299. Referring to FIG. 2D, the sense amps 287-291 senses the voltage on the bit line and amplifies voltage swings to recognizable logic levels. In an embodiment, the decoder 293 accesses the logic levels from the sense amps 287-291 and generates the binary outputs 295-299.

FIG. 3A shows a semiconductor structure 300 that includes a deep in memory architecture (DIMA) memory system that includes a backend positioned memory array that includes a one transistor and one resistor (1T1R) memory cell structure according to an embodiment. In FIG. 3A the semiconductor structure 300 includes substrate 301, TCN layer 303, interlayer dielectric layers 305-319, metal layers 321-335 and DIMA memory cells 337.

Referring to FIG. 3A, interlayer dielectric layers 305-319 are formed above substrate 301. Metal layers 321-335 are formed between the dielectric layers 305-319. The TCN layer 303 is formed above the substrate 301. The DIMA memory cells 337 are formed in the backend of the semiconductor structure 300.

In an embodiment, the interlayer dielectric layers 305-319 can be formed from silicon dioxide. In other embodiments, the interlayer dielectric layers 305-319 can be formed from other materials. In an embodiment, the substrate 301 can be formed from silicon. In other embodiments, the substrate can be formed from other materials. In an embodiment, the metal layers 321-335 can be formed from copper or nickel. In other embodiments, the metal layers 321-335 can be formed from other materials. In an embodiment, the TCN layer 303 is formed from copper or nickel. In other embodiments, the TCN layer 303 can be formed from other materials.

Figure 3B:
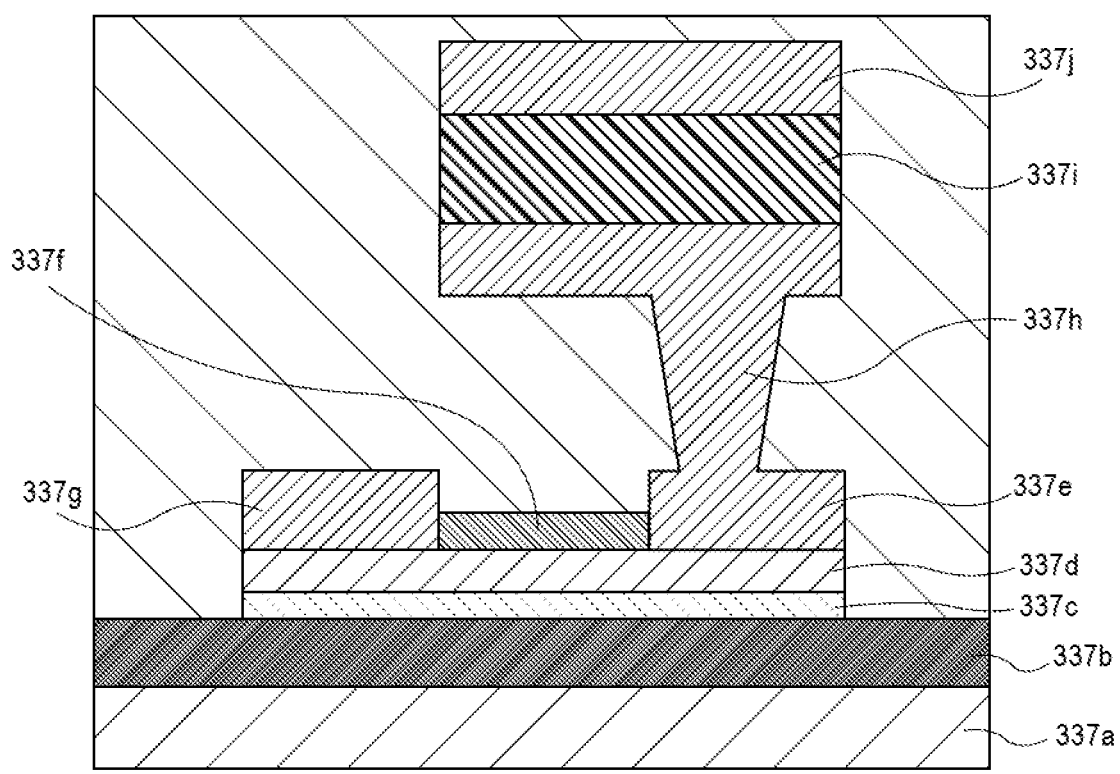
FIG. 3B shows the structure of a DIMA memory cell according to an embodiment.

FIG. 3B shows the structure of a DIMA memory cell according to an embodiment. Referring to FIG. 3B the DIMA memory cells 337 include interlayer dielectric material 337a, gate 337b, high-k dielectric 337c, thin film transistor (TFT) material 337d, drain 337e, capping layer 337f, source 337g, metal contact 337h, RRAM 337i and metal contact 337j.

In FIG. 3B, the gate 337b is formed above the interlayer dielectric material 337a. The high-k dielectric layer 337c is formed above the gate 337b. The TFT material 337d is formed above the high-k dielectric layer 337c. The capping layer 337f is formed above the TFT material 337d and between the source 337g and the drain 337e. The source 337g is formed above the TFT material 337d and adjacent a first side of the capping layer 337f. The drain 337e is formed above the TFT material 337d and adjacent a second side of the capping layer 337f. The metal contact 337h is formed above the drain 337e and includes via and planar portions. The RRAM 337i is formed above the planar portion of the metal contact 337h and below the metal contact 337j.

In an embodiment, the interlayer dielectric material 337a can be formed from silicon dioxide. In other embodiments, the dielectric material 337a can be formed from other materials. In an embodiment, the high-k dielectric 337c can be formed from hafnium dioxide. In other embodiments, the high-k dielectric 337c can be formed from other materials. In an embodiment, thin film transistor (TFT) 337d can be formed from silicon. In other embodiments, the TFT 337d can be formed from other materials. In an embodiment, the capping layer 337f can be formed from a nitride. In other embodiments, the capping layer 337f can be formed from other materials. In an embodiment, the metal contact 337h can be formed from copper or nickel. In other embodiments, the metal contact 337h can be formed from other materials. In an embodiment, the RRAM 337i can be formed from a complex oxide or a chalcogenide material. In other embodiments, the RRAM 337i can be formed from other materials. In an embodiment, the metal contact 337j can be formed from copper or nickel. In other embodiments, the metal contact 337j can be formed from other materials.

Referring again to FIG. 3A, in an embodiment, both the transistor and resistor component of the 1T1R memory cell 337 is formed in the backend of the semiconductor structure 300. This configuration frees up space in the front end of the semiconductor structure 300. For example, in an embodiment, transistors 339 that are a part of circuitry that is used for computation purposes that in previous approaches had to be formed on the frontend periphery can be formed in the central portion of the frontend of the semiconductor structure 300. In a previous approach about 30-40 percent of the frontend can be occupied by peripheral circuitry and about 60-70 percent of the frontend can be occupied by array circuitry. In an embodiment, because both the transistor and the resistor component of memory cells of the memory cell array is formed in the backend, the space that the memory cell array would occupy using previous approaches in the frontend, can be used for other circuitry, such as peripheral circuitry. In an embodiment, nearly 95 percent array efficiency is achieved. In other embodiments, other or greater array efficiencies can be achieved.

In operation, multiple word lines are activated and cause the passing of current onto respective bit lines. The magnitude of the current depends on the resistance value of the associated memory cells. In an embodiment, these currents, as opposed to voltages, are summed and sensed. In an embodiment, an advantage of this approach is that a steady state current reference is less easily disturbed than is a voltage reference by phenomena such as random coupling capacitances. In a previous approach, two arrays are needed to store inputs and weights. In such approaches, the computation of values can be done in either the array that stores the inputs or the array that stores the weights. In SRAM, only digital numbers can be stored. Therefore, numbers that are represented by multiple bits require an area for storage of each of the required bits. For example, a binary representation of the number 3 would require two bits. However, in an embodiment, a single RRAM storage element can store any number between 0-7. In other embodiments, the RRAM storage element can store other ranges of numbers.

Figure 4:
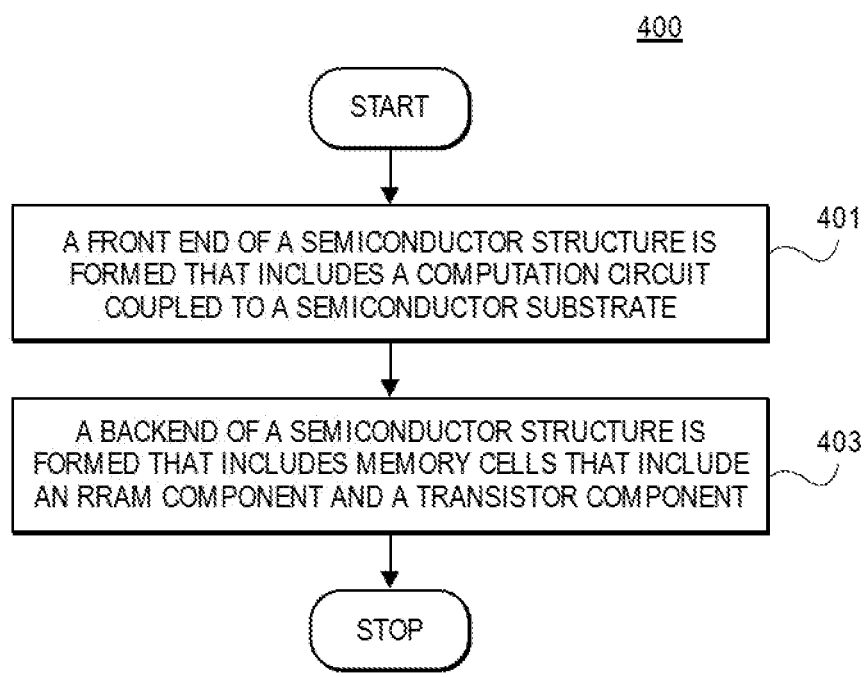
FIG. 4 is a flowchart of a method of forming deep in memory architecture according to an embodiment.

FIG. 4 is a flowchart 400 of a method of forming deep in memory architecture according to an embodiment. Referring to FIG. 4, at 401, a frontend of a semiconductor structure is formed. In an embodiment, the forming of the frontend includes forming a semiconductor substrate and forming a computation circuit coupled to the semiconductor substrate. At 403, a backend of a semiconductor structure is formed that includes forming an RRAM component of a memory cell and forming a transistor switch of the memory cell that is coupled to the RRAM component. In an embodiment, the memory cell has a 1T-1R structure. In an embodiment, the transistor includes RRAM material coupled to a drain of the transistor. In an embodiment, the transistor includes a back gate coupled to an interlayer dielectric material. In an embodiment, the transistor includes a high-k dielectric layer coupled to the back gate. In an embodiment, the transistor includes channel material coupled to the high-k dielectric layer.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
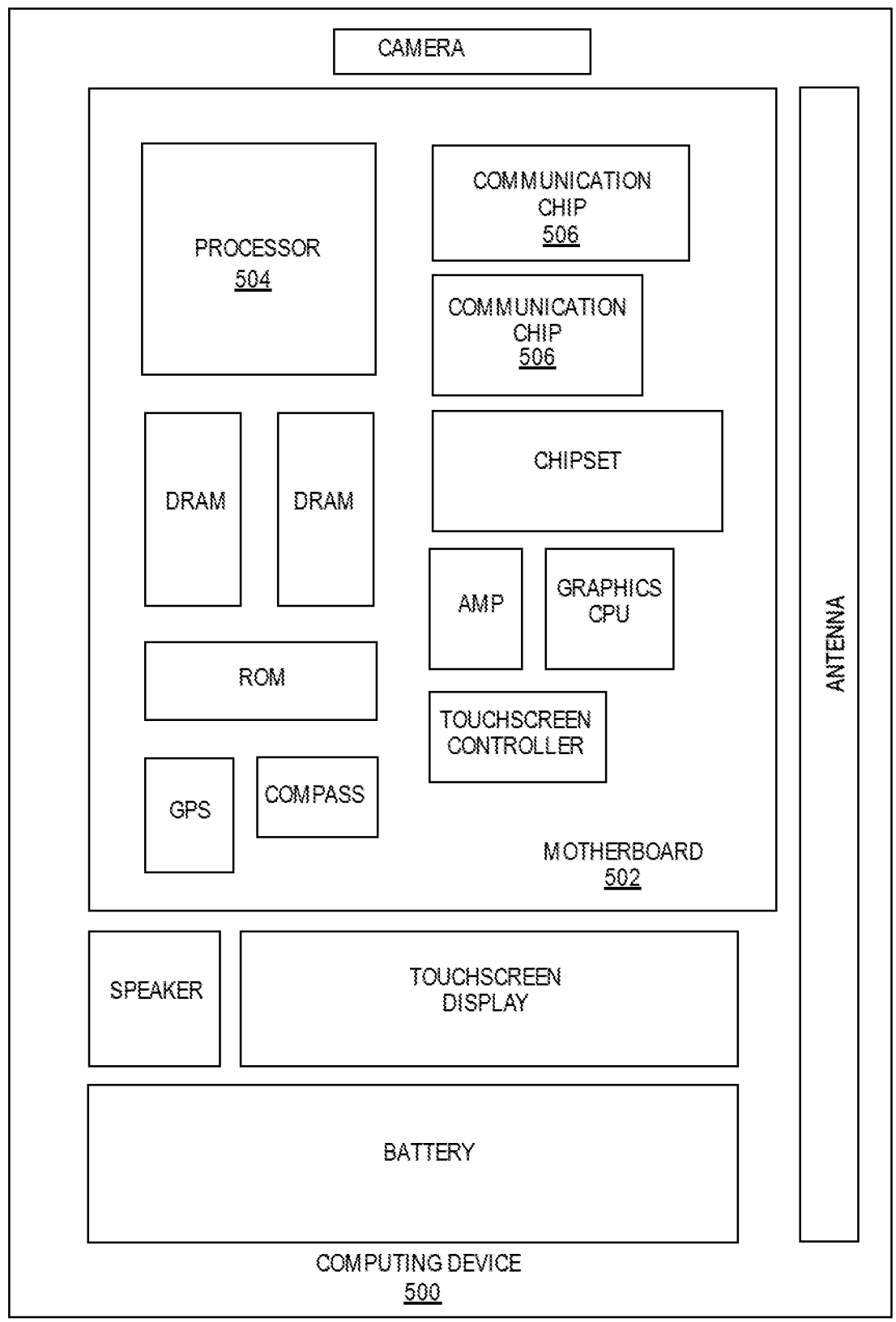
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
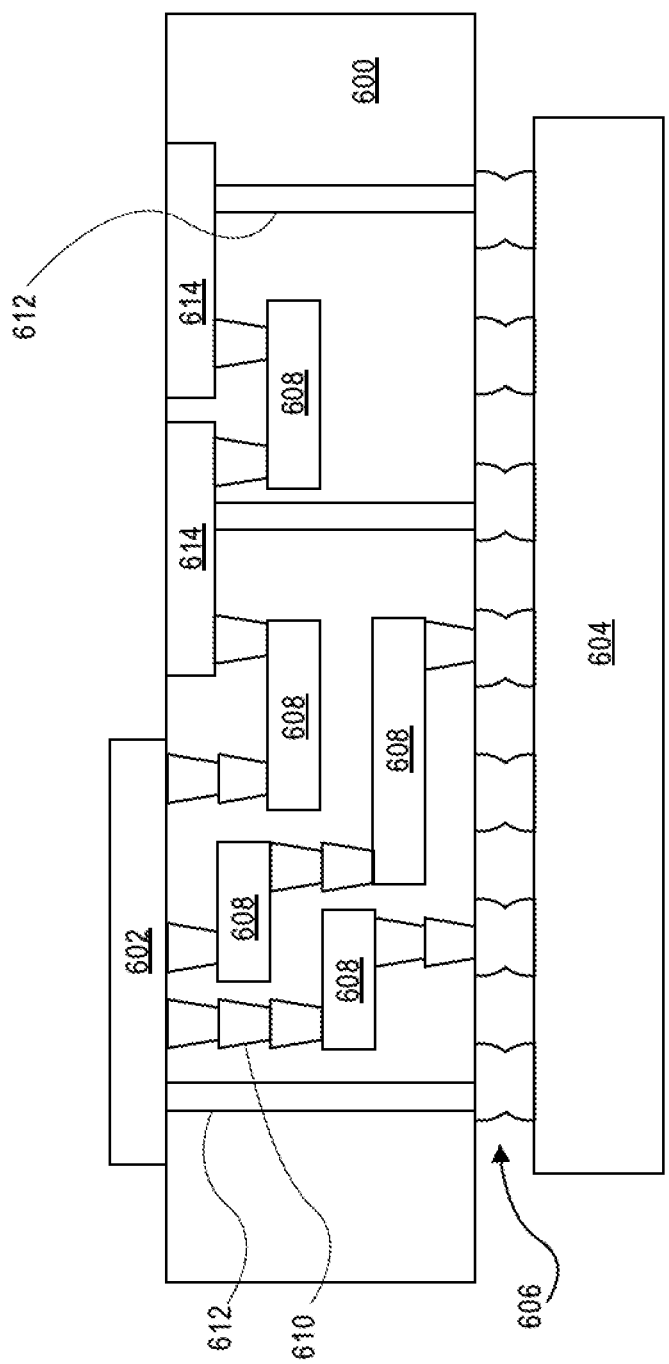
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A DIMA semiconductor structure includes a frontend that
includes, a semiconductor substrate, a transistor switch of a memory cell coupled to the semiconductor substrate, and a computation circuit on the periphery of the frontend coupled to the semiconductor substrate; and, a backend that includes an RRAM component of the memory cell that is coupled to the transistor switch.

Example embodiment 2: The DIMA semiconductor structure of example embodiment 1, wherein the memory cell has a 1T-1R structure.

Example embodiment 3: The DIMA semiconductor structure of example embodiment 1, wherein the transistor includes RRAM material coupled to a drain of the transistor.

Example embodiment 4: The DIMA semiconductor structure of example embodiment 1, wherein the transistor includes a back gate coupled to an interlayer dielectric material.

Example embodiment 5: The DIMA semiconductor structure of example embodiment 4, wherein the transistor includes a high-k dielectric layer coupled to the back gate.

Example embodiment 6: The DIMA semiconductor structure of example embodiment 5, wherein the transistor includes channel material coupled to the high-k dielectric layer.

Example embodiment 7: The DIMA semiconductor structure of example embodiment 6, wherein the transistor includes a capping layer coupled to the channel material.

Example embodiment 8: A DIMA semiconductor structure, including a frontend that includes: a semiconductor substrate; and a computation circuit coupled to the semiconductor substrate, and, a backend that includes: an RRAM component of a memory cell; and a transistor switch of the memory cell coupled to the RRAM component.

Example embodiment 9: The DIMA semiconductor structure of example embodiment 8, wherein the memory cell has a 1T-1R structure.

Example embodiment 10: The DIMA semiconductor structure of example embodiment 8, wherein the transistor includes RRAM material coupled to a drain of the transistor.

Example embodiment 11: The DIMA semiconductor structure of example embodiment 8, wherein the transistor includes a back gate coupled to an interlayer dielectric material.

Example embodiment 12: The DIMA semiconductor structure of example embodiment 11, wherein the transistor includes a high-k dielectric layer coupled to the back gate.

Example embodiment 13: The DIMA semiconductor structure of example embodiment 12, wherein the transistor includes channel material coupled to the high-k dielectric layer.

Example embodiment 14: The DIMA semiconductor structure of example embodiment 13, wherein the transistor includes a capping layer coupled to the channel material.

Example embodiment 15: A method including forming a frontend that includes forming a semiconductor substrate; and forming a computation circuit coupled to the semiconductor substrate, and, forming a backend that includes: forming an RRAM component of a memory cell; and forming a transistor switch of the memory cell coupled to the RRAM component.

Example embodiment 16: The method example embodiment 15, wherein the memory cell has a 1T-1R structure.

Example embodiment 17: The method of example embodiment 15, wherein the transistor includes RRAM material coupled to a drain of the transistor.

Example embodiment 18: The method of example embodiment 15, wherein the transistor includes a back gate coupled to an interlayer dielectric material.

Example embodiment 19: The method of example embodiment 18, wherein the transistor includes a high-k dielectric layer coupled to the back gate.

Example embodiment 20: The method of example embodiment 19, wherein the transistor includes channel material coupled to the high-k dielectric layer.

What is claimed is:

1. A deep in-memory architecture (DIMA) semiconductor structure, comprising:
    a frontend that includes:
        a semiconductor substrate;
        a transistor switch of a memory cell coupled to the semiconductor substrate; and
        a computation circuit on the periphery of the frontend coupled to the semiconductor substrate;
    and,
    a backend that includes:
        an RRAM component of the memory cell that is coupled to the transistor switch; and
    wherein the memory cell has a one transistor and one resistor (1T-1R) structure.

2. The DIMA semiconductor structure of claim 1, wherein the RRAM component includes RRAM material coupled to a drain of the transistor.

3. The DIMA semiconductor structure of claim 1, wherein the transistor includes a back gate coupled to an interlayer dielectric material.

4. The DIMA semiconductor structure of claim 3, wherein the transistor includes a high-k dielectric layer coupled to the back gate.

5. The DIMA semiconductor structure of claim 4, wherein the transistor includes channel material coupled to the high-k dielectric layer.

6. The DIMA semiconductor structure of claim 5, wherein the transistor includes a capping layer coupled to the channel material.

7. A deep in-memory architecture (DIMA) semiconductor structure, comprising:
    a frontend that includes:
        a semiconductor substrate; and
        a computation circuit coupled to the semiconductor substrate,
    and,
    a backend that includes:
        an RRAM component of a memory cell; and
        a transistor switch of the memory cell coupled to the RRAM component.

8. The DIMA semiconductor structure of claim 7, wherein the memory cell has a 1T-1R structure.

9. The DIMA semiconductor structure of claim 7, wherein the RRAM component includes RRAM material coupled to a drain of the transistor.

10. The DIMA semiconductor structure of claim 7, wherein the transistor includes a back gate coupled to an interlayer dielectric material.

11. The DIMA semiconductor structure of claim 10, wherein the transistor includes a high-k dielectric layer coupled to the back gate.

12. The DIMA semiconductor structure of claim 11, wherein the transistor includes channel material coupled to the high-k dielectric layer.

13. The DIMA semiconductor structure of claim 12, wherein the transistor includes a capping layer coupled to the channel material.

14. A method, comprising:
    forming a frontend that includes:
        forming a semiconductor substrate; and
        forming a computation circuit coupled to the semiconductor substrate,
    and,
    forming a backend that includes:
        forming an RRAM component of a memory cell; and
        forming a transistor switch of the memory cell coupled to the RRAM component.

15. The method claim 14, wherein the memory cell has a 1T-1R structure.

16. The method of claim 14, wherein the RRAM component includes RRAM material coupled to a drain of the transistor.

17. The method of claim 14, wherein the transistor includes a back gate coupled to an interlayer dielectric material.

18. The method of claim 17, wherein the transistor includes a high-k dielectric layer coupled to the back gate.

19. The method of claim 18, wherein the transistor includes channel material coupled to the high-k dielectric layer.

\* \* \* \* \*